(12) United States Patent
Zhang et al.

(10) Patent No.: US 7,916,986 B2
(45) Date of Patent: Mar. 29, 2011

(54) ERBIUM-DOPED SILICON NANOCRYSTALLINE EMBEDDED SILICON OXIDE WAVEGUIDE

(75) Inventors: Hao Zhang, Vancouver, WA (US); Pooran Chandra Joshi, Vancouver, WA (US); Apostolos T. Voutsas, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 412 days.

(21) Appl. No.: 12/112,767

(22) Filed: Apr. 30, 2008

(65) Prior Publication Data
US 2009/0232449 A1   Sep. 17, 2009

Related U.S. Application Data

(63) Continuation-in-part of application No. 11/418,273, filed on May 4, 2006, now Pat. No. 7,544,625, which is a continuation-in-part of application No. 11/327,612, filed on Jan. 6, 2006, now Pat. No. 7,723,242, and a continuation-in-part of application No. 11/013,605, filed on Dec. 15, 2004, now Pat. No. 7,446,023, and a continuation-in-part of application No. 10/801,377, filed on Mar. 15, 2004, now Pat. No. 7,122,487, and a continuation-in-part of application No. 11/139,726, filed on May 26, 2005, now Pat. No. 7,381,595, and a continuation-in-part of application No. 10/871,939, filed on Jun. 17, 2004, now Pat. No. 7,186,663, and a continuation-in-part of application No. 10/801,374, filed on Mar. 15, 2004, now Pat. No. 7,087,537.

(51) Int. Cl.
*G02B 6/26* (2006.01)
*B05D 5/06* (2006.01)
*C23C 14/48* (2006.01)
*C23C 14/16* (2006.01)
*C23F 1/00* (2006.01)
*H01L 21/00* (2006.01)

(52) U.S. Cl. .......... 385/31; 385/129; 385/130; 385/131; 427/163.2; 427/527; 427/526; 216/2; 438/29; 438/31

(58) Field of Classification Search .................. 385/14, 385/31, 129, 130, 131, 132, 141, 143, 140; 438/29, 31; 372/7; 427/163.2, 527, 526; 216/2
See application file for complete search history.

(56) References Cited

U.S. PATENT DOCUMENTS
6,060,743 A * 5/2000 Sugiyama et al. ............ 257/321
(Continued)

FOREIGN PATENT DOCUMENTS
WO   WO 2004/105201   12/2004

OTHER PUBLICATIONS

Y. Hibino: Silica-based planar lightwave circuits and their applications, MRS Bulletin, May 2003, p. 365.
(Continued)

*Primary Examiner* — Brian M Healy
(74) *Attorney, Agent, or Firm* — Law Office of Gerald Maliszewski; Gerald Maliszewski (57) ABSTRACT

An erbium (Er)-doped silicon (Si) nanocrystalline embedded silicon oxide (SiOx) waveguide and associated fabrication method are presented. The method provides a bottom layer, and forms an Er-doped Si nanocrystalline embedded SiOx film waveguide overlying the bottom layer, having a minimum optical attenuation at about 1540 nanometers (nm). Then, a top layer is formed overlying the Er-doped SiOx film. The Er-doped SiOx film is formed by depositing a silicon rich silicon oxide (SRSO) film using a high density plasma chemical vapor deposition (HDPCVD) process and annealing the SRSO film. After implanting $Er^+$ ions, the Er-doped SiOx film is annealed again. The Er-doped Si nanocrystalline SiOx film includes has a first refractive index (n) in the range of 1.46 to 2.30. The top and bottom layers have a second refractive index, less than the first refractive index.

21 Claims, 6 Drawing Sheets

U.S. PATENT DOCUMENTS

| | | | |
|---|---|---|---|
| 7,087,537 B2 * | 8/2006 | Joshi et al. | 438/778 |
| 7,122,487 B2 * | 10/2006 | Joshi | 438/788 |
| 7,186,663 B2 * | 3/2007 | Joshi et al. | 438/758 |
| 7,220,609 B2 * | 5/2007 | Zacharias | 438/29 |
| 7,381,595 B2 * | 6/2008 | Joshi et al. | 438/149 |
| 7,446,023 B2 * | 11/2008 | Joshi et al. | 438/475 |
| 7,544,625 B2 * | 6/2009 | Joshi et al. | 438/778 |
| 7,723,242 B2 * | 5/2010 | Joshi et al. | 438/778 |
| 2004/0136681 A1 * | 7/2004 | Drewery et al. | 385/142 |
| 2009/0232449 A1 * | 9/2009 | Zhang et al. | 385/31 |

OTHER PUBLICATIONS

W. Skorupa, J. M. Sun, S. Prucnal, et al: Rare earth ion implantation for silicon-based light emission: from infrared to ultraviolet, Mater. Res. Soc. Symp. Proc., vol. 866, 2005.

* cited by examiner

ERBIUM-DOPED SILICON NANOCRYSTALLINE EMBEDDED SILICON OXIDE WAVEGUIDE

RELATED APPLICATIONS

This application is a continuation-in-part of a patent application entitled, SILICON OXIDE THIN-FILMS WITH EMBEDDED NANOCRYSTALLINE SILICON, invented by Pooran Joshi et al., Ser. No. 11/418,273, filed May 4, 2006 now U.S. Pat. No. 7,544,625, which is a Continuation-in-Part of the following applications:

ENHANCED THIN-FILM OXIDATION PROCESS, invented by Pooran Joshi et al., Ser. No. 11/327,612, filed Jan. 6, 2006 now U.S. Pat. No. 7,723,242;

HIGH-DENSITY PLASMA HYDROGENATION, invented by Pooran Joshi et al., Ser. No. 11/013,605, filed Dec. 15, 2004 now U.S. Pat. No. 7,446,023;

DEPOSITION OXIDE WITH IMPROVED OXYGEN BONDING, invented by Pooran Joshi, Ser. No. 10/801,377, filed Mar. 15, 2004, now issued as U.S. Pat. No. 7,122,487;

HIGH-DENSITY PLASMA OXIDATION FOR ENHANCED GATE OXIDE PERFORMANCE, invented by Joshi et al., Ser. No. 11/139,726, filed May 26, 2005 now U.S. Pat. No. 7,381,595;

HIGH-DENSITY PLASMA PROCESS FOR SILICON THIN-FILMS, invented by Pooran Joshi, Ser. No. 10/871,939, filed Jun. 17, 2004, now issued as U.S. Pat. No. 7,186,663;

METHOD FOR FABRICATING OXIDE THIN-FILMS, invented by Joshi et al., Ser. No. 10/801,374, filed Mar. 15, 2004, now issued as U.S. Pat. No. 7,087,537.

All the above-referenced applications are incorporated herein by reference.

BACKGROUND OF THE INVENTION

1. Field of the Invention

This invention generally relates to integrated circuit (IC) fabrication and, more particularly, to an erbium-doped silicon (Si) nanocrystalline embedded Si oxide (SiOx) waveguide and an associated fabrication method.

2. Description of the Related Art

The evolution of semiconductor industry in the last several decades has largely relied on scaling down the minimum feature size of IC devices, in which metal (copper and aluminum alloys) thin films are used as interconnects for electrical signal transmission. However, as aggressive scaling continues, metal interconnects are a problem in keeping pace with the ever increasing speed and power consumption of IC devices. One solution to this problem utilizes optical interconnects, which rely upon photons instead of electrons for on-chip and chip-to-chip communication. Flat panel displays, which are fabricated primarily on glass substrates, face similar challenges as well, as more and more functions and devices are being added on the glass panels. In additional, the flat panel display industry faces the challenges of metal interconnects within a panel, as the panel development continues increasing beyond Generation 8. The use of optical interconnects can decrease interconnect delays and power consumption, and increase device speed in IC devices and flat panel displays.

It is known to use optical fiber as an active medium for optical signal amplification in Erbium-doped fiber amplifiers (EDFAs) for long-distance communication. However, optical fiber cannot be integrated into ICs using conventional processes. External light sources can be fabricated using III-V compound semiconductors for applications on Si-based IC devices. However, these materials require extra, non-conventional fabrication steps. As such, hybrid assemblies still dominate the optoelectronics assembly process, to connect optoelectronics devices to Si-based IC devices.

Silicon dioxide ($SiO_2$) has potential as an optical waveguide material since it exhibits minimum attenuation near 1540 nanometers (nm), which is the most widely used wavelength in long-distance optical communication. A $SiO_2$ waveguide can be fabricated on Si wafers and glass display panels using conventional Si-compatible process that are widely available. Another attractive feature of $SiO_2$ is that once doped with Erbium ions ($Er^+$) at the proper levels, it can convert light to a wavelength of 1540 nm, which coincides with the wavelength of minimum attenuation for optical signals in an $SiO_2$ medium. Thus, optical signals in this wavelength range can either be transmitted further from a light source, or with less power, through the same length of $SiO_2$ waveguide.

However, as an indirect semiconductor Si has been long considered as a poor light-emitting material. In recent years, Si-nc (nanocrystalline) embedded Si-rich Si oxide (SRSO) has been found to have promising light-emitting properties. The optimal emission wavelengths of Si-nc SRSO as fabricated by conventional methods typically ranges from ~600 nm to ~900 nm. Adding $Er^+$ ions in Si-nc embedded SRSO films shifts the emission wavelength of the combined material from being centered near 900 nm, to 1540 nm, and increases the quantum efficiency of the emission significantly. The Si-nc particles work as sensitizers to excite Er+ ions in Si oxides matrix.

There are no known processes that are able to fabricate Si nanocrystalline SRSO film on temperature sensitive substrates such as glass, which cannot be heated over a temperature of about 650° C.

It would be advantageous if optical waveguides operating at 1540 nm could be fabricated using low-temperature Si-based IC fabrication processes.

SUMMARY OF THE INVENTION

Combining Si-nc and Er doping to an SRSO film creates the possibility of an optical gain medium (waveguide) for optical interconnects in IC devices and flat panel displays fabricated on glass panels. The advantages of this approach are that all materials and processes are based on Si-based manufacturing processes. Further, such a waveguide does not require a costly III-V based 980 nm pump laser. An Er-doped Si nanocrystalline embedded SiOx waveguide would also permit the integration of a light emission function with waveguides and photodetectors/receivers. The present invention describes a method for using Er+ ion doped Si-nc sensitized Si oxide as optical-gain medium (waveguide) for optical signal transmission or even amplification within and between IC devices, or within and between flat panel displays.

Accordingly, a method is provided for forming an Er-doped Si nanocrystalline embedded SiOx waveguide. The method provides a bottom layer, and forms an Er-doped Si nanocrystalline embedded SiOx film waveguide overlying the bottom layer, having a minimum optical attenuation at about 1540 nanometers (nm). Then, a top layer is formed overlying the Er-doped SiOx film. The Er-doped SiOx film is formed by depositing a silicon rich silicon oxide (SRSO) film using a high density plasma chemical vapor deposition (HD-PCVD) process and annealing the SRSO film. After implanting $Er^+$ ions, the Er-doped SiOx film is annealed again.

The Er-doped Si nanocrystalline SiOx film includes has a first refractive index (n) in the range of 1.46 to 2.30. The top and bottom layers have a second refractive index, less than the first refractive index. For example, the top and bottom layers may be silicon dioxide with a second refractive index of about 1.46. In one aspect, the method patterns the SiOx film waveguide, forming a waveguide end. Then, the waveguide end is subjected to a reactive ion etching (REI), which forms a mirrored optical interface.

Additional details of the above-described method and an erbium-doped Si nanocrystalline embedded SiOx waveguide are presented below.

DETAILED DESCRIPTION

Figure 1:
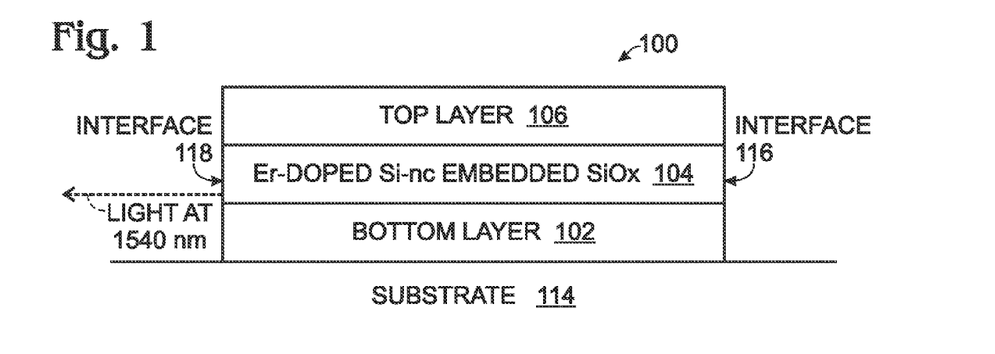
FIG. 1 is a partial cross-sectional view of an erbium (Er)-doped silicon (Si) nanocrystalline embedded silicon oxide (SiOx) waveguide.

FIG. 1 is a partial cross-sectional view of an erbium (Er)-doped silicon (Si) nanocrystalline embedded silicon oxide (SiOx) waveguide. The waveguide 100 comprises a bottom layer 102. An Er-doped Si nanocrystalline embedded SiOx film 104 overlies the bottom layer 102, where "X" is less than or equal to 2. As used herein, Si nanocrystals have a diameter in the range of about 1 to 10 nm. The Er-doped Si nanocrystalline embedded SiOx film 104 has a minimum optical attenuation at about 1540 nanometers (nm). A top layer 106 overlies the Er-doped SiOx film. The Er-doped Si nanocrystalline embedded SiOx film 104 has a first refractive index (n) in the range of 1.46 to 2.30. The top layer 106 and the bottom layer 102 each have a second refractive index, less than the first refractive index. Note: the top and bottom layers need not necessarily have the same refractive index. In one aspect, the top layer 106 and bottom layer 102 are Si dioxide having a second refractive index of about 1.46.

The waveguide may be fabricated on a substrate 114, which is made from a material such as Si or glass. It should also be understood that the waveguide also includes "sides" made from a dielectric such as silicon dioxide, with a refractive index less than the first refractive index, which cannot be seen in cross-section. The "sides" would be adjacent the Er-doped Si nanocrystalline embedded SiOx film 104 if seen in a plan (top or bottom) view.

The waveguide 100 further includes an input optical interface 116 to accept light in a first wavelength range. An output optical interface 118 supplies light having a second wavelength. The input optical interface 116 accepts light in a first wavelength range between about 600 nanometers (nm) and less than about 1540 nm. The output optical interface 118 supplies light having a second wavelength of about 1540 nm.

The optical interfaces 116 and 118 may connect to another section of waveguide (not shown), accept light from a light source (not shown) such as an electrically pumped light source, or supply light to a light target (not shown) such as a photodiode. In some aspects, the waveguide may be composed of an Er-doped SiOx film section with two ends, where an angled mirror optical interface is formed at each section. In other aspect, the waveguide may be composed from a plurality of these two-end sections.

Figure 2:
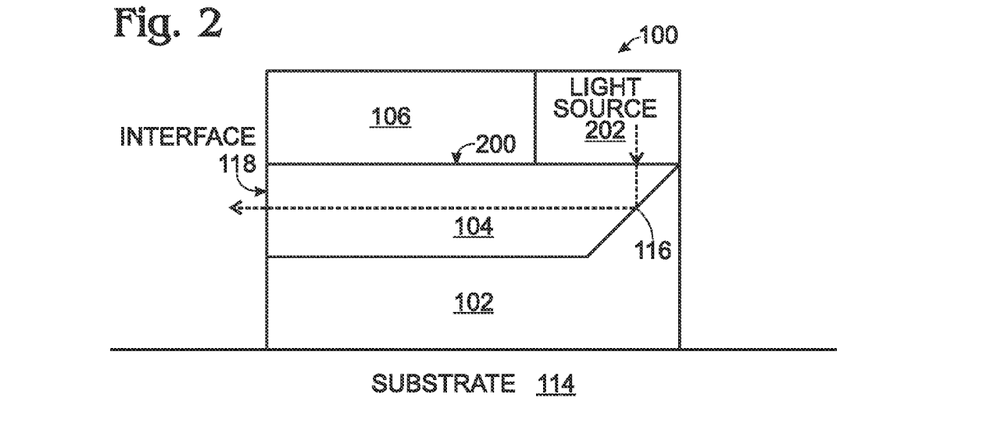
FIG. 2 is a partial cross-sectional view a first variation of the waveguide of FIG. 1.

FIG. 2 is a partial cross-sectional view a first variation of the waveguide of FIG. 1. In this aspect, the input optical interface 116 is an angled mirror optical interface. For example, the top layer 106 may have an interface surface 200 overlying the angled mirror optical interface 116. In one aspect as shown, an electrically pumped light source 202 is at least partially formed in the top layer 106 having an output 204 overlying the angled mirror optical interface. Alternately but not shown, the light source may be formed in the bottom layer or substrate and the mirror interface angled to accept light from the source.

Figure 3:
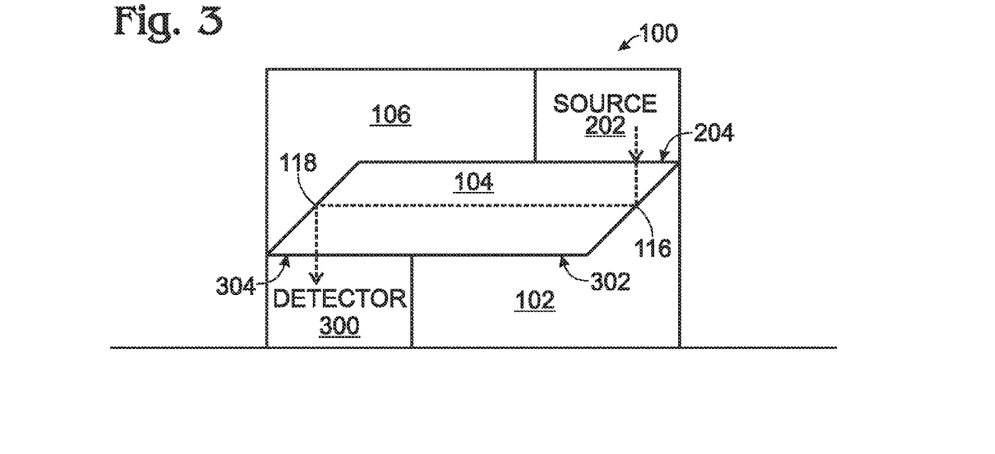
FIG. 3 is a partial cross-sectional view a second variation of the waveguide of FIG. 1.

FIG. 3 is a partial cross-sectional view a second variation of the waveguide of FIG. 1. In this aspect, both the input optical interface 116 and output optical interface 118 are angled mirror optical interfaces. As in FIG. 2, the top layer 106 may have an interface surface 200 overlying the angled mirror optical interface 116. An electrically pumped light source 202 is at least partially formed in the top layer 106 having an output 204 overlying the angled mirror optical interface. Further, an optical detector 300 is at least partially formed in the bottom layer 102 having an interface surface 302. The detector 300 has an input 304 underlying the angled mirror optical interface 118. In other aspects not shown, the source is in the bottom layer and detector is in the top layer. In a different aspect not shown, both the source and detector are in the same layer. Alternately but not shown, the source, detector, and angled mirror interfaces may be on the sides of the Er-doped Si nanocrystalline embedded SiOx film, as seen from the top.

Functional Description

Si-rich Si oxide films can be deposited on Si and quartz wafers using a HDP-CVD tool. The deposition conditions are chosen so that the refractive index of the deposited films varies from 1.70 to 1.95.

Table 1 Table 1 lists the deposition conditions, measured refractive index, and extinction coefficient of the deposited SRSO films. Samples 22 and 32 were annealed in a conventional horizontal furnace at 1100° C. for 3 hours, and Sample 42 was annealed for 5 hours. Before the annealing, the SRSO samples were coated with a 9-nm-thick $SiN_x$ cap layer to prevent or reduce oxidization of Si-nc particles near the film surface during the high-temperature annealing. All films show a strong PL emission centered near 900 nm after a first annealing. Samples were implanted with $Er^+$ ions after the first annealing using the following implantation condition: $1E15/cm^2$ and 100 keV. After the $Er^+$ ion implant, a second annealing (activation annealing) were carried out between 700° C. to 1000° C. for 15 to 60 min.

TABLE 1

HDP-CVD deposition conditions, measured refractive index, and extinction coefficient of deposited SRSO films

| | Deposition Conditions | | | | Optical Const. @365 nm | | Optical Const. @632 nm | |
|---|---|---|---|---|---|---|---|---|
| Sample ID | $SiH_4$, sccm | $N_2O$, sccm | Temp, °C. | Power (W) | Thick. (nm) | n | k | n | k |
| 22 | 25 | 33 | 300 | 400 | ~200 | 1.95 | 0.053 | 1.80 | 0.00800 |
| 32 | 25 | 41 | 250 | 250 | ~200 | 1.90 | 0.033 | 1.74 | 0.00700 |
| 42 | 25 | 53 | 150 | 250 | ~200 | 1.70 | 0.002 | 1.63 | 0.00001 |

FIGS. 1-3 depict an optical-gain medium (waveguide) based on Er-doped Si-nc embedded Si oxide, which can be integrating with light sources based in IC devices and flat panel displays. The light source and optical waveguide may be components of an optical interconnect system transmitting optical signals within an IC device or a flat panel display, and between IC devices or flat panel displays.

Er+ ions, which are located in a Si oxide matrix, can be excited indirectly through optically generated electron-hole pairs within the Si-nc that transfer energy to the Er+ ions. The nanocrystalline Si works as a sensitizer in the process. Si-nc embedded Si oxide has two important characteristics: (1) a pump absorption cross-section that is several orders of magnitude higher than that of direct excited Er+ ions, and (2) a wide emission wavelength ranging from 650 nm to 950 nm. Doped with a proper level of Er+ ions, Si-nc embedded Si oxide can be used as an optical-gain medium (waveguide) or even an optical amplifier that can be integrated into Si-based IC devices and flat panel displays. In addition, this waveguide also can be pumped with low-power and low-cost light sources such as devices based on the same type of SRSO, with or without rare-earth doping. Using this approach, low-cost light sources can replace conventional laser devices using III-V compound semiconductors.

Figure 4A:
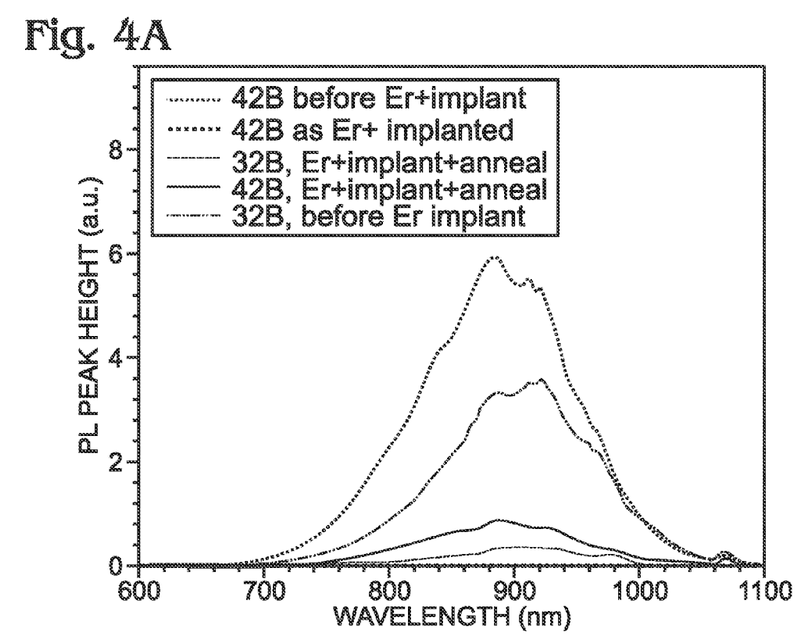
FIGS. 4A and B are graphs depicting the photoluminescence (PL) emissions spectra of Si-nc embedded SRSO films with and without Er+ doping in wavelengths between 1300 and 1800 nm, and between 600 and 1100 nm, respectively.
Figure 4B:
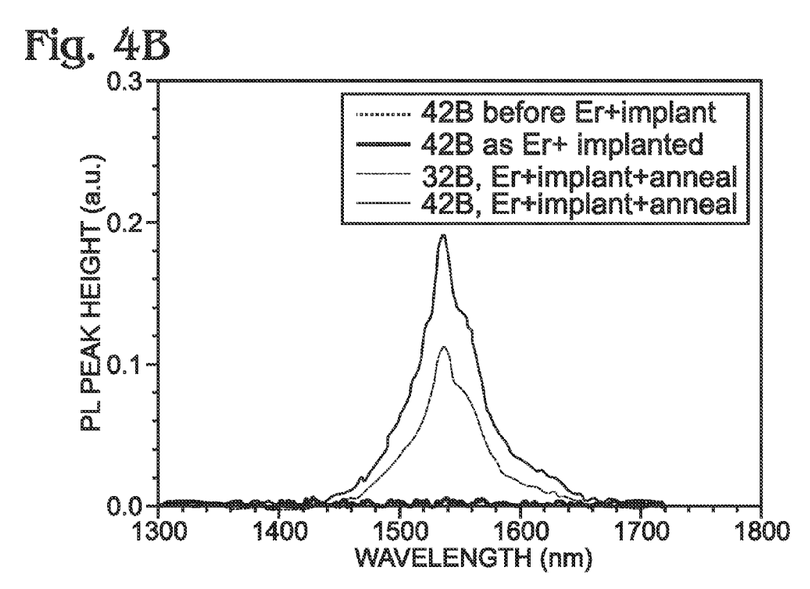

FIGS. 4A and B are graphs depicting the photoluminescence (PL) emissions spectra of Si-nc embedded SRSO films with and without Er+ doping in wavelengths between 1300 and 1800 nm, and between 600 and 1100 nm, respectively. Samples 32 and 42 are shown, before and after Er+ implant, in wavelengths between 600 and 1100 nm (FIG. 4A), and between 1300 and 1800 nm (FIG. 4B). Before the Er+ implant, the films show strong emissions centered near 900 nm, but no sign of emission at or near 1536 nm. The Er+ implant and the subsequently annealing give rise to a new emission centered at 1536 nm, causing the emission near 900 nm to decrease significantly. These results suggest that the emissions centered near 900 nm are "transferred" to the emission centered at 1536 nm due to the Er+ doping. Er+ ions, which are located in Si oxide matrix, are excited indirectly through optically generated electron-hole pairs within the Si-nc that transfer energy to the Er+ ions. The Si-nc works as a sensitizer in the process.

The SRSO film thickness is about 200 nm. The films were annealed at 1100° C. for 5 hours after the deposition, and ion implanted with $Er^+$ followed by an activation annealing at 800° C. for 60 minutes. The $Er^+$ ion implantation conditions were 100 keV and $1E15/cm^2$.

Table 2 summarizes the PL wavelength and peak height, and nc-Si size and density in the films before and after the $Er^+$ implantation. Sample 32 was deposited at a lower $N_2O$ gas flow ($N_2O$=41 sccm) than that of Sample 42 ($N_2O$=53 sccm), resulting in a higher Si-nc density ($2.0E+11/cm^2$) than that of Sample 42 ($1.5E+11/cm^2$). However, Sample 32 produces a lower PL emission than that of Sample 42, suggesting there is an optimal Si-nc density for the maximum PL emission before and after the rare-earth ion implant.

TABLE 2

PL wavelengths and peak height, nc-Si size and density in the films before and after $Er^+$ implant

| | Before $Er^+$ Implant | | | | After $Er^+$ Implant and Annealing | | | |
|---|---|---|---|---|---|---|---|---|
| | PL Peak Height (a.u.) | | nc-Si size and density | | PL Peak Height (a.u.) | | nc-Si size and density | |
| Wafer ID | at 1536 nm | at 896 nm | Size, nm | Density, /cm² | at 1536 nm | at 896 nm | Size, nm | Density, /cm² |
| 0665-32B | ~0 | 3.6 | / | / | 0.11 | 0.34 | 1.5 to 3.5 | 2.0E+11 |
| 0665-42B | ~0 | 5.9 | 2 to 4 | 1.4E+11 | 0.19 | 0.83 | 1.5 to 3.5 | 1.5E+11 |

Figure 5:
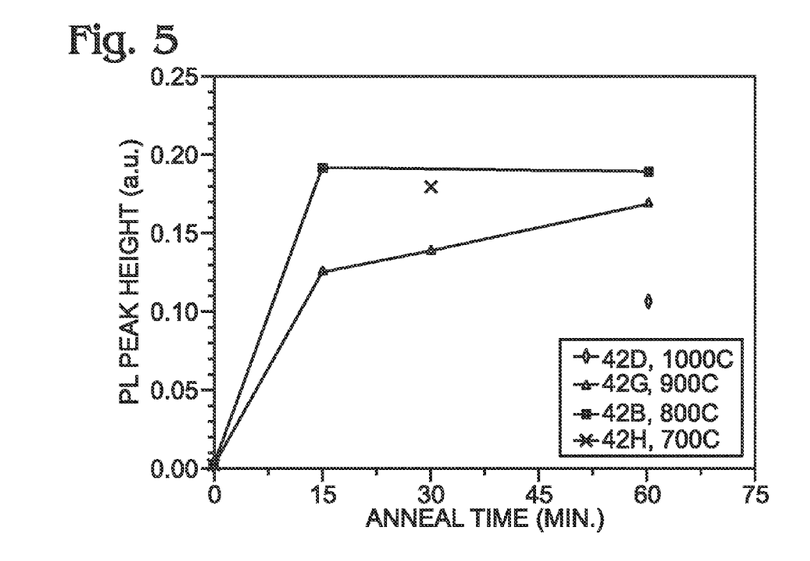
FIG. 5 is a graph depicting variations the PL in the $Er^+$ doped Si-nc sensitized SRSO films as a result of variations in the second annealing temperature and time.

FIG. 5 is a graph depicting variations the PL in the $Er^+$ doped Si-nc sensitized SRSO films as a result of variations in the second annealing temperature and time. Shown are annealing temperatures for an SRSO film thickness of 200 nm. The films were annealed at 1100° C. for 5 hours after the deposition, and annealed for a second time at various temperatures after the $Er^+$ ion implantation. The Er ion implantation conditions are: 100 keV and $1E15/cm^2$.

Figure 6:
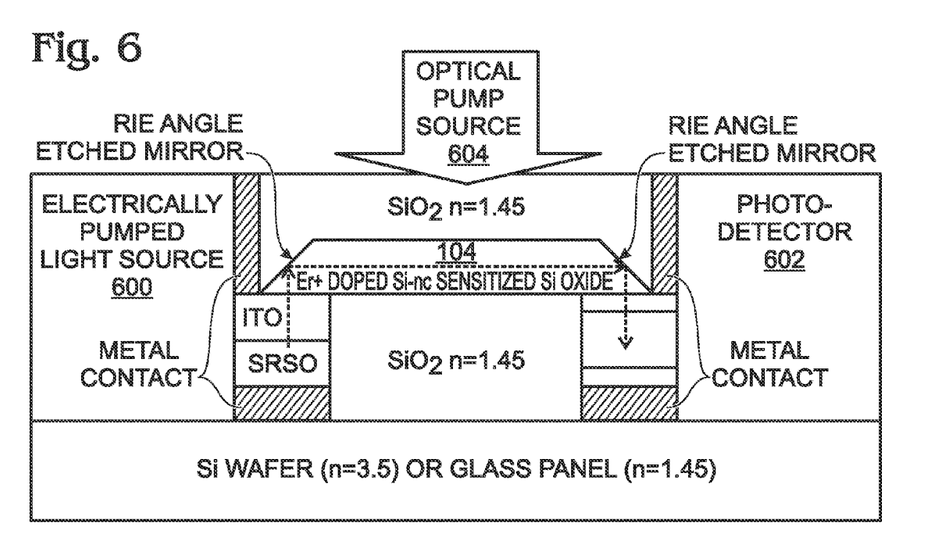
FIG. 6 is a partial cross-sectional view depicting a fourth variation of the waveguide of FIG. 1.

FIG. 6 is a partial cross-sectional view depicting a fourth variation of the waveguide of FIG. 1. The depicted waveguide is an optical interconnect system built in a Si-based IC device or a flat panel display on glass substrates. The components include an electrically pumped light source device 600 based on SRSO, with or without rare-earth doping, an optical-gain medium 104 based on $Er^+$ doped Si-nc sensitized Si oxide, and a photodetector/receiver 602. The signals emitted from the light source typically having a wavelength of less than 980 nm, are guided into the optical-gain medium (waveguide) where their wavelength is "converted" to 1540 nm. The signals at 1540 nm can be further amplified by an internal or external light source 604 (with a wavelength typically <980 nm), which is either electrically or optically excited, similar to the way light is amplified in $Er^+$ doped fiber amplifiers (EDFAs).

Figure 7:
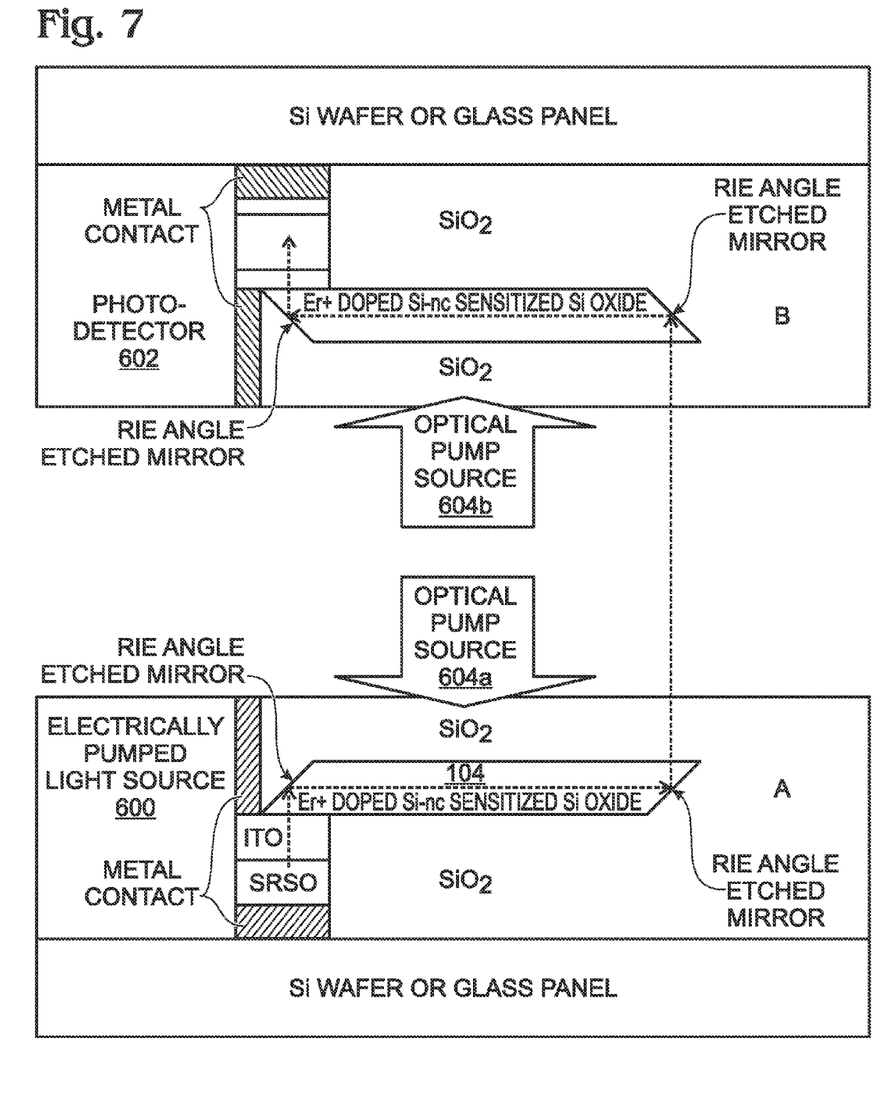
FIG. 7 is a partial cross-sectional view depicting a system of wave guides.

FIG. 7 is a partial cross-sectional view depicting a system of waveguides. Shown is an optical interconnect system built as two Si-based IC devices or two flat panel displays on glass substrates (A and B). An electrically pumped light source 600 based on SRSO, with or without rare-earth doping, is formed in substrate A. Optical-gain media (waveguides) based on Er+ doped Si-nc sensitized Si oxides 104 are formed in both substrates A and B. Optional (internal or external) optical pump sources 604a and 604b may be formed in both substrates A and B, either electrically or optically excited. A photodetector/receiver 602 is formed in substrate B.

Figure 8:
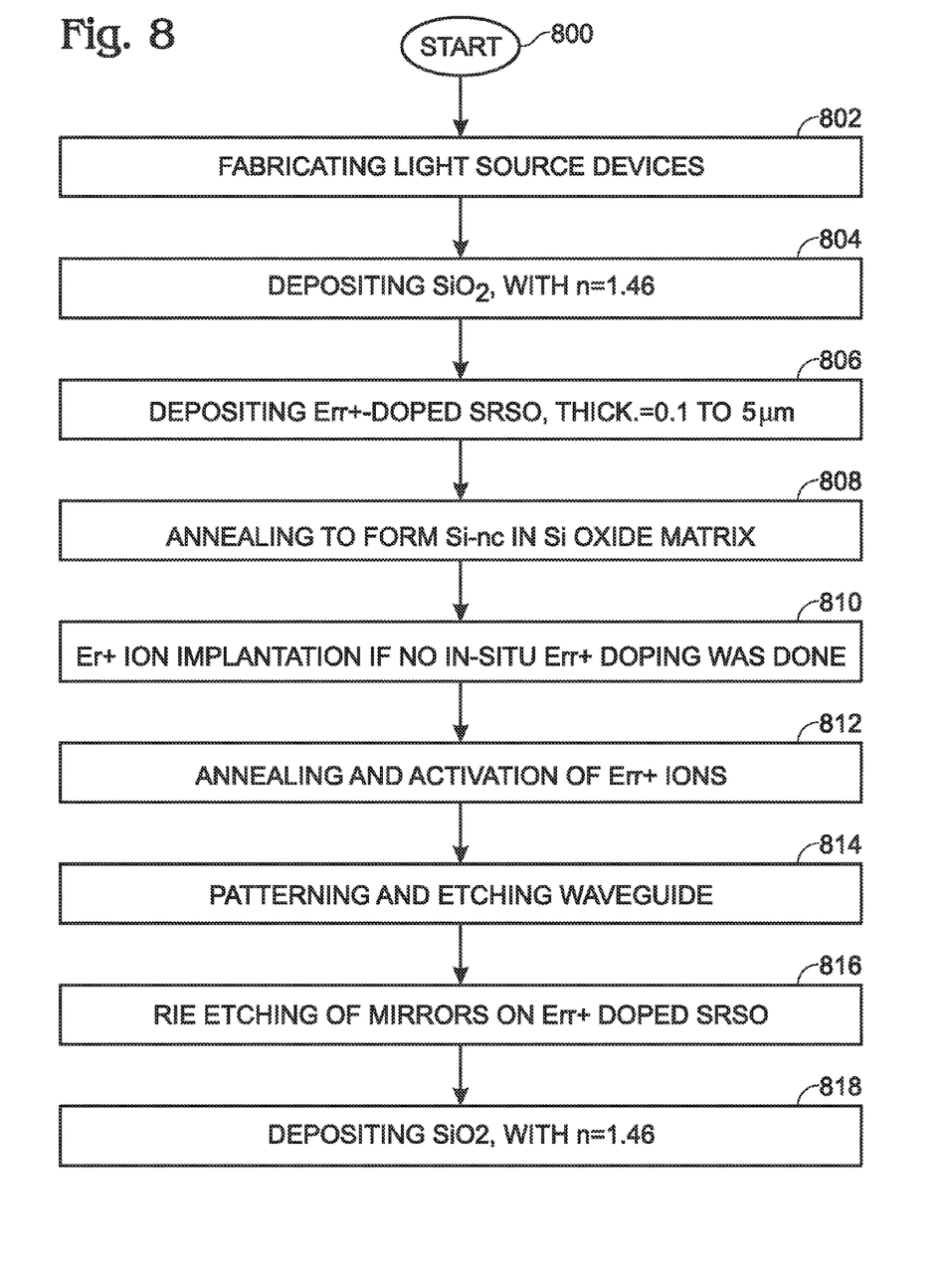
FIG. 8 shows steps in the fabrication of an Er-doped Si nanocrystalline embedded SiOx film waveguide.

FIG. 8 shows steps in the fabrication of an Er-doped Si nanocrystalline embedded SiOx film waveguide. Step 802 fabricates light source devices based on the Si-nc sensitized Si oxide, with or without rare-earth doping. Step 804 deposits a $SiO_2$ layer, which typically has a refractive index=1.46. Step 806 prepares SRSO films using $SiO_2$ growth/deposition and subsequently Si ion implantation. Alternately, Step 806 directly deposits SRSO with or without in-situ doping of Er+ using HDP-CVD, PECVD, sputtering, or spin-on coating. The refractive indices of the SRSO varies from 1.46 to 2.30, but is larger than that of the surrounding $SiO_2$ layer, by controlling the excess Si content in the films. The thickness of the SRSO varies from 0.1 to 10 μm. Step 808 forms Si-nc in the Si oxide using thermal annealing, rapid thermal annealing (RTA), laser annealing, or pulsed thermal annealing. However, the step is not limited to any particular method of forming nanocrystals. Step 810 dopes the SRSO film with Er+ ions by Er+ ion implantation, if in-situ doping 1 s not performed in Step 806. Step 812 anneals and activates the Er+ ions by using thermal annealing, RTA, laser annealing, etc. Step 814 patterns and etches the optical-gain medium (waveguide). Step 816 RIE etches mirrors on Er+ doped SRSO. Step 818 deposits a $SiO_2$ layer over the Er-doped Si nanocrystalline embedded SiOx film.

Figure 9:
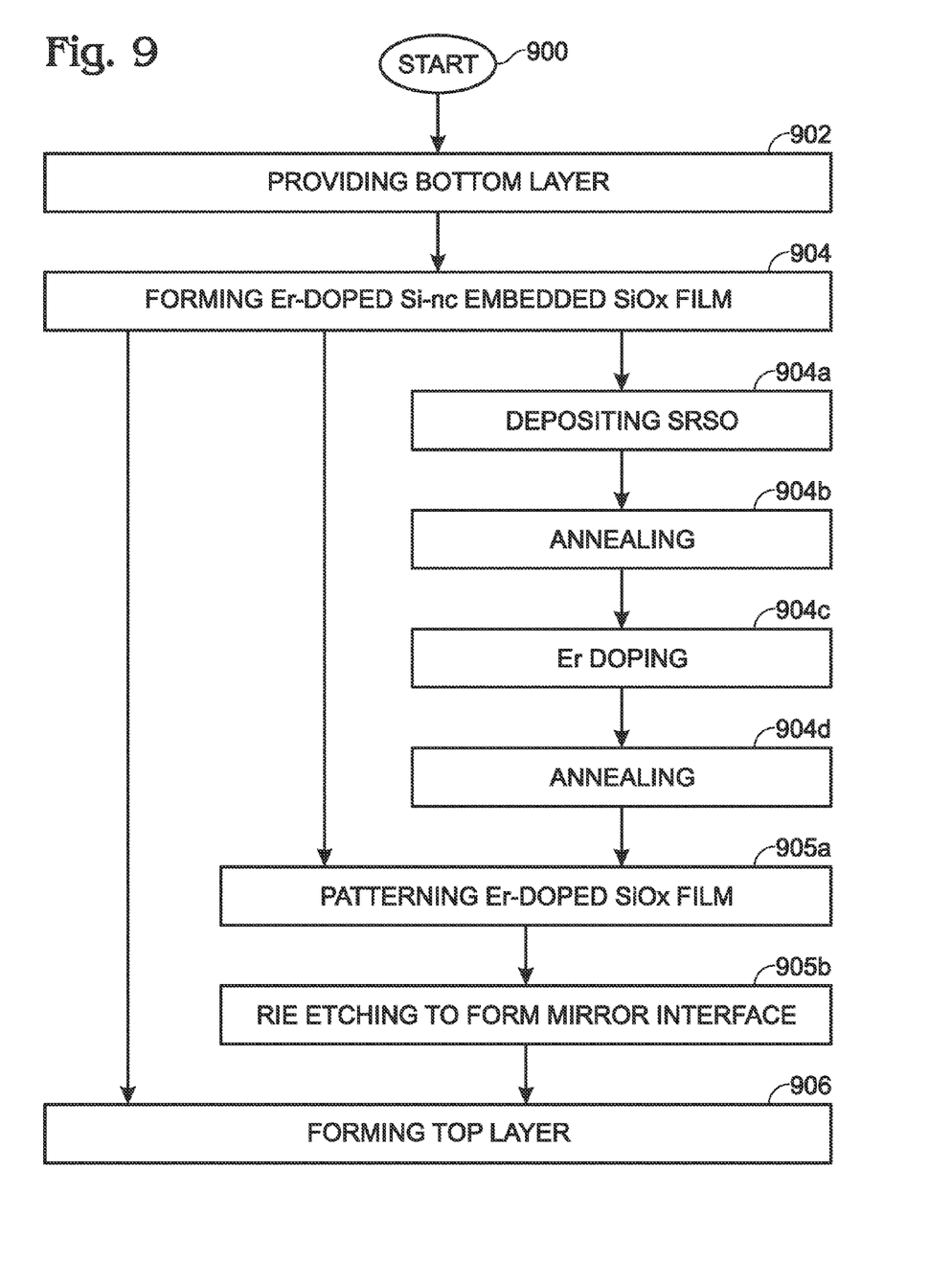
FIG. 9 is a flowchart illustrating another aspect of the method for forming an Er-doped Si nanocrystalline embedded SiOx waveguide.

FIG. 9 is a flowchart illustrating another aspect of the method for forming an Er-doped Si nanocrystalline embedded SiOx waveguide. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 900.

Step 902 provides a bottom layer. Step 904 forms an Er-doped Si nanocrystalline embedded SiOx film waveguide overlying the bottom layer, having a minimum optical attenuation at about 1540 nanometers (nm). In one aspect, Step 904 forms an Er-doped SiOx film having a first refractive index (n) in the range of 1.46 to 2.30. Step 906 forms a top layer overlying the Er-doped SiOx film. Forming the top and bottom layers in Steps 902 and 906 includes forming top and bottom layers having a second refractive index, less than the first refractive index. For example, the top and bottom layers may be silicon dioxide having a second refractive index of about 1.46.

In one aspect, forming the Er-doped SiOx film in Step 904 includes substeps. Step 904a deposits an SRSO film using a HDPCVD process. Typically, the SRSO film has a thickness in the range of about 100 to 10,000 nm. Step 904b anneals the SRSO film. For example, the annealing may be performed at a temperature in the range of about 600 to 1100° C. for a duration in the range of about 5 minutes to 5 hours. Step 904c implants Er+ ions. For example, Er+ ions may be implanted with an energy of about 100 keV, with respect to a middle thickness region of the Er-doped SiOx film, and a dose in a range of about $5\times10^{15}$ to $1\times10^{17}$ $cm^{-2}$. Step 904d anneals the Er-doped SiOx film. For example, the annealing may be performed at a temperature in the range of about 600 to 1000° C. for a duration in the range of about 5 minutes to 60 minutes.

In one aspect, Step 905a patterns the SiOx film waveguide, forming a waveguide end, and Step 905b reactive ion etches (REI) the waveguide end, forming a mirrored optical interface.

An erbium (Er)-doped silicon (Si) nanocrystalline embedded silicon oxide (SiOx) waveguide and associated fabrication process have been presented. Specific structures and process details have been presented as examples to illustrate the invention. However, the invention is not limited to merely theses examples. Although Er doping has been discussed in detail, other rare earth elements might also be applied to enable the present invention. Other variations and embodiments will occur to those skilled in the art.

We claim:

1. A method for forming an erbium (Er)-doped silicon (Si) nanocrystalline embedded silicon oxide (SiOx) waveguide, the method comprising:
   providing a bottom layer;
   forming an Er-doped Si nanocrystalline embedded SiOx film waveguide overlying the bottom layer, having a minimum optical attenuation at about 1540 nanometers (nm);
   forming a top layer overlying the Er-doped SiOx film; and,
   wherein forming the Er-doped SiOx film includes:
      depositing a silicon rich silicon oxide (SRSO) film using a high density plasma chemical vapor deposition (HDPCVD) process;
      annealing the SRSO film;
      implanting Er+ ions; and,
      annealing the Er-doped SiOx film.

2. The method of claim 1 wherein depositing silicon SRSO includes depositing SRSO to a thickness in a range of about 100 to 10,000 nm.

3. The method of claim 1 wherein annealing the SRSO film includes annealing at a temperature in a range of about 600 to 1100° C. for a duration in a range of about 5 minutes to 5 hours.

4. The method of claim 1 wherein implanting Er+ ions includes implanting Er+ ions with an energy of about 100 keV, with respect to a middle thickness region of the Er-doped SiOx film, and a dose in a range of about $5\times10^{15}$ to $1\times10^{17}$ $cm^{-2}$.

5. The method of claim 1 wherein annealing the Er-doped SiOx film includes annealing at a temperature in a range of about 600 to 1000° C. for a duration in a range of about 5 minutes to 60 minutes.

6. The method of claim 1 wherein forming the Er-doped Si nanocrystalline SiOx film includes forming an Er-doped SiOx film having a first refractive index (n) in the range of 1.46 to 2.30.

7. The method of claim 6 wherein forming the top and bottom layers includes forming top and bottom layers having a second refractive index, less than the first refractive index.

8. The method of claim 7 wherein forming the top and bottom layers includes forming silicon dioxide top and bottom layers having a second refractive index of about 1.46.

9. The method of claim 1 further comprising:
   patterning the SiOx film waveguide, forming a waveguide end; and
   reactive ion etching (RED the waveguide end, forming a mirrored optical interface.

10. An erbium (Er)-doped silicon (Si) nanocrystalline embedded silicon oxide (SiOx) waveguide, the waveguide comprising:

a bottom layer;

an Er-doped Si nanocrystalline embedded SiOx film, having a first refractive index (n) in the range of 1:46 to 2.30, overlying the bottom layer;

a top layer overlying the Er-doped SiOx film;

an input optical interface to accept light in a first wavelength range; and, an output optical interface to supply light having a second wavelength.

11. The waveguide of claim 10 wherein the input optical interface accepts light in a first wavelength range between about 600 nanometers (nm) and less than 1540 nm; and, wherein the output optical interface supplies light having a second wavelength of about 1540 nm.

12. The waveguide of claim 10 wherein Er-doped Si nanocrystalline embedded SiOx film has a minimum optical attenuation at about 1540 nm.

13. The waveguide of claim 10 wherein the top and bottom layers have a second refractive index, less than the first refractive index.

14. The waveguide of claim 13 wherein the top and bottom layers are Si dioxide having a second refractive index of about 1.46.

15. The waveguide of claim 10 wherein the input optical interface is an angled, mirror optical interface.

16. The waveguide of claim 15 wherein the top layer has an interface surface overlying the angled mirror optical interface.

17. The waveguide of claim 15 further comprising:

an electrically pumped light source at least partially formed in the top layer having an output overlying the angled mirror optical interface.

18. The waveguide of claim 15 further comprising:

an optical detector at least partially formed in the top layer having an input overlying the angled mirror optical interface.

19. A method for forming an erbium (Er)-doped silicon (Si) nanocrystalline embedded silicon oxide (SiOx) waveguide, the method comprising:

providing a bottom layer;

forming an Er-doped Si nanocrystalline embedded SiOx film waveguide overlying the bottom layer, having a minimum optical attenuation at about 1540 nanometers (nm), and a first refractive index (n) in the range of 1.46 to 2.30; and, forming a top layer overlying the Er-doped SiOx film.

20. A method for forming an erbium (Er)-doped silicon (Si) nanocrystalline embedded silicon oxide (SiOx) waveguide, the method comprising:

providing a bottom layer;

forming an Er-doped Si nanocrystalline embedded SiOx film waveguide overlying the bottom layer, having a minimum optical attenuation at about 1540 nanometers (nm);

forming a top layer overlying the Er-doped SiOx film;

patterning the SiOx film waveguide, forming a waveguide end; and, reactive ion etching (REI) the waveguide end, forming a mirrored optical interface.

21. An erbium (Er)-doped silicon (Si) nanocrystalline embedded silicon oxide (SiOx) waveguide, the waveguide comprising:

a bottom layer;

an Er-doped Si nanocrystalline embedded SiOx film overlying the bottom layer;

a top layer overlying the Er-doped SiOx film;

an input angled mirror optical interface to accept light in a first wavelength range; and, an output optical interface to supply light having a second wavelength.

* * * * *

UNITED STATES PATENT AND TRADEMARK OFFICE
CERTIFICATE OF CORRECTION

| | | |
|---|---|---|
| PATENT NO. | : 7,916,986 B2 | Page 1 of 1 |
| APPLICATION NO. | : 12/112767 | |
| DATED | : March 29, 2011 | |
| INVENTOR(S) | : Hao Zhang et al. | |

It is certified that error appears in the above-identified patent and that said Letters Patent is hereby corrected as shown below:

In column 8, line 63 (claim 9), the acronym "REI" has been incorrectly printed as --RED--. Claim 9 should appear as follows:

9. The method of claim 1 further comprising:
  patterning the SiOx film waveguide, forming a waveguide end; and,
  reactive ion etching (REI) the waveguide end, forming a mirrored optical interface.

Signed and Sealed this
Twenty-fourth Day of May, 2011

David J. Kappos
*Director of the United States Patent and Trademark Office*